US006799308B2

(12) United States Patent
You et al.

(10) Patent No.: US 6,799,308 B2
(45) Date of Patent: Sep. 28, 2004

(54) TIMING ANALYSIS OF LATCH-CONTROLLED DIGITAL CIRCUITS WITH DETAILED CLOCK SKEW ANALYSIS

(75) Inventors: Eileen H. You, Saratoga, CA (US); Matthew E. Becker, Harvard, MA (US); Thomas E. Dillinger, Chelmsford, MA (US); Micah C. Knapp, Cambridge, MA (US); Daniel J. Flees, San Jose, CA (US); Peter R. O'Brien, Austin, TX (US); Chung Lau Chan, San Carlos, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 84 days.

(21) Appl. No.: 10/325,806

(22) Filed: Dec. 19, 2002

(65) Prior Publication Data

US 2004/0123259 A1 Jun. 24, 2004

(51) Int. Cl.[7] ............................................. G06F 17/50
(52) U.S. Cl. .................................. 716/6; 716/4; 716/5
(58) Field of Search ......................................... 716/4–6

(56) References Cited

U.S. PATENT DOCUMENTS

| | | | | |
|---|---|---|---|---|
| 6,247,137 | B1 | * | 6/2001 | Wickeraad .................. 713/401 |
| 6,516,362 | B1 | * | 2/2003 | Magro et al. ................. 710/58 |
| 6,550,045 | B1 | * | 4/2003 | Lu et al. ........................ 716/6 |
| 6,651,230 | B2 | * | 11/2003 | Cohn et al. .................... 716/6 |

OTHER PUBLICATIONS

Zhang et al., "Clock Synchronization Algorithms for Network Measurements," IEEE, Jun. 2002, pp. 160–169.*

Karem A. Sakallah et al.; *Analysis And Design Of Latch-Controlled Synchronous Digital Circuits;* IEEE Transactions On Computer–Aided Design, vol. 11, No. 3, Mar. 1992; pp. 322–333.

David Harris et al.; *Timing Analysis Including Clock Skew;* IEEE Transactions Computer–Aided Design Of Integrated Circuits And Systems; vol. 18, No. 11, Nov. 1999; pp. 1608–1618.

Thomas G. Szymanski et al.; *Verifying Clock Schedules;* IEEE 1992; pp. 124–131.

S. Posluszny et al.; *"Timing Closure By Design," A High Frequency Microprocessor Design Methodology;* © IBM Austin Research Lab, Austin, TX; 6 Pages; http://www.research.ibm.com.

S. Posluszny et al.; *Design Methodology For A 1.0 GHz Microprocessor;* © IBM Austin Research Lab, Austin, TX; 7 Pages; http://www.research.ibm.com.

Arthur F. Champernowne et al.; *Latch–to–Latch Timing Rules;* IEEE Transactions On Computers, vol. 39, No. 6, Jun. 1990; pp. 798–808.

* cited by examiner

*Primary Examiner*—Vuthe Siek
(74) *Attorney, Agent, or Firm*—Hamilton & Terrile, LLP; Stephen A. Terrile

(57) ABSTRACT

In accordance with the present invention, a method, system, computer system, and computer program product for considering clock skew in designing digital systems with latch-controlled circuits are provided. The disclosure teaches a method for determining whether logic operations can be performed within the available time and allows detailed modeling of clock skew for different domains of the integrated circuit. Taking clock skew into account for each domain, worst-case timing paths can be determined for circuits controlled by either flip-flops or latches. A design of an integrated circuit can be revised or verified using the method taught. The disclosure envisions that integrated circuits, printed circuit boards, computer systems and other components will be manufactured based upon designs developed with the method taught.

23 Claims, 10 Drawing Sheets

$$\begin{bmatrix} S_{11} & S_{12} & S_{13} & S_{14} & S_{15} & \cdots & & S_{1(T-1)} & S_{1T} \\ \cdots & \cdots & \cdots & \cdots & \cdots & \cdots & & \cdots & \cdots \\ S_{N1} & \cdots & & & & & S_{N(T-2)} & S_{N(T-1)} & S_{NT} \\ \cdots & \cdots & \cdots & \cdots & \cdots & \cdots & & \cdots & \cdots \\ S_{T1} & \cdots & & & & & & S_{T(T-1)} & S_{TT} \end{bmatrix}$$

FIG. 5A

$$\begin{bmatrix} L & R & R & G & G & \cdots & G & G \\ \cdots & \cdots & \cdots & \cdots & \cdots & \cdots & \cdots & \cdots \\ G & \cdots & R & R & L & R & R & G \\ \cdots & \cdots & \cdots & \cdots & \cdots & \cdots & \cdots & \cdots \\ G & G & G & G & G & R & R & L \end{bmatrix}$$

FIG. 5B

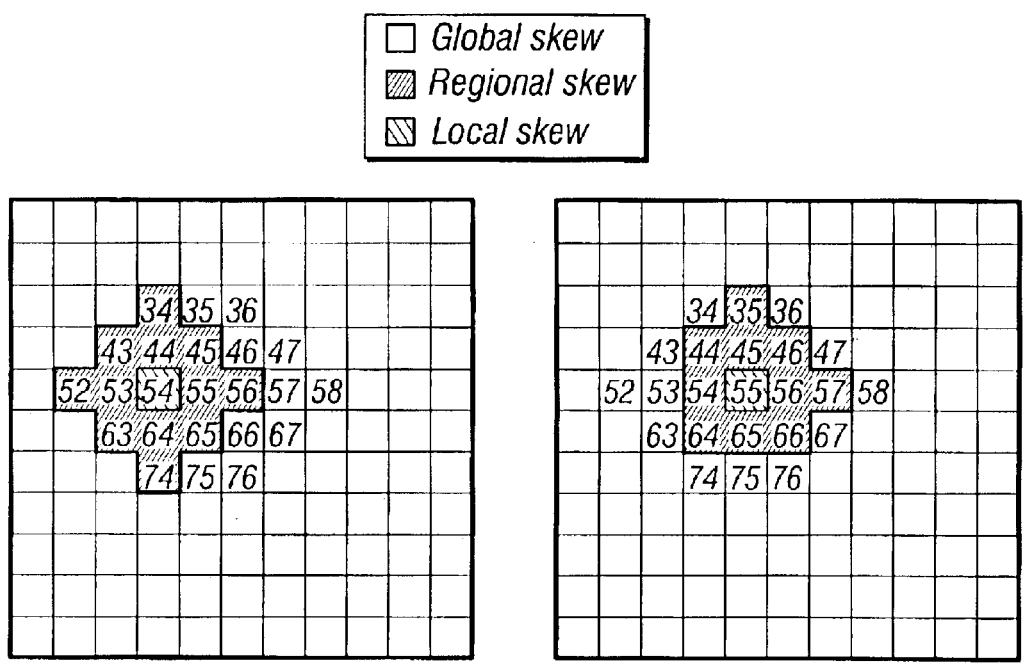
*FIG. 6A*  *FIG. 6B*

TIMING ANALYSIS OF LATCH-CONTROLLED DIGITAL CIRCUITS WITH DETAILED CLOCK SKEW ANALYSIS

BACKGROUND OF THE INVENTION

1. Field of the Invention

The present invention relates to the field of timing analysis of integrated circuit designs.

2. Description of the Related Art

One of the important signals in the design of a digital system, such as a computer system, is the clock. Ideally, the clock signal is a periodic step waveform with abrupt transitions between the low and high values. The clock signal orders the multitude of events occurring in digital circuits.

Ordering the events occurring in a digital circuit can be compared to the function of a traffic light which determines which cars are allowed to move at an intersection. The clock also makes sure that all operations are completed before the next operation starts, just as a traffic light should remain green long enough to allow a car or pedestrian to cross the road. A clock can be adjusted just as the timing of a traffic light can be adjusted. Adjusting the timing of a traffic light can ensure that two cars traveling on intersecting roads do not both arrive at a traffic signal at the same time and both have a green (or red) light. Similarly, adjusting the clock of a digital integrated circuit can ensure optimal throughput and prevent collisions in data being transmitted.

FIG. 1A represents an idealized clock as a periodic step waveform with abrupt transitions. As shown in FIG. 1A, the transitions from the low value to the high value appear instantaneously. The change in voltage from the low value to the high value is represented by a vertical line. However, there can be a delay associated with transferring electrical charges along a conductor due to finite resistance and capacitance. Therefore, FIG. 1B represents a more realistic clock waveform. Referring to FIG. 1B, the change from a low voltage value to the high value is not instantaneous. Thus, clock signal transitions have a finite slope, or "slew."

Referring to FIG. 1C, a register module can sample the value of the input signal at the rising edge of the clock. The value is preserved and appears at the output until the next cycle of the clock signal when a new sample is taken. FIG. 2A through FIG. 2C compare clock signals and the associated function of a hypothetical "edge-sensitive" register module.

For illustrative purposes, assume that an additional load has been connected to the circuit (such as additional registers) and the clock signal has deteriorated. Deterioration of the clock signal due to an additional load causes the slope of the line connecting the low voltage value and the high voltage value to become less steep. This slew degradation of the clock signal caused by the additional load can be seen by comparing clock signals $\phi$ and $\phi'$ in FIG. 2A. An idealized function of a register output is shown in FIG. 2B. When the deterioration is within acceptable limits, the behavior of the register is not significantly affected and the expected output is maintained for the duration of the clock cycle. However, when the deterioration of the clock slew exceeds an acceptable value, the register can produce unexpected results. For example, when clock slew degradation is severe, the register output may make an incorrect transition, such as the one shown in FIG. 2C.

Thus, global effects, such as adding registers or other load to a clock network, can change the behavior of an individual module of an integrated circuit. The effects are not the same for all modules, but are dependent upon the particular register circuit. Propagation of these erroneous output signals can cause system malfunctions and unexpected shutdowns.

Effects of clock signal deterioration manifested as clock skew in operations of synchronous digital circuits are shown in FIGS. 3A through 3C. FIG. 3A shows a circuit including two cascaded registers. Both registers shown in FIG. 3A are "edge-sensitive" and operate on the rising edge of the clock signal. Under normal operating conditions, the input is sampled by the first register. The sample taken by the first register appears at the output, labeled Out in FIG. 3A, one clock period (or one cycle) later.

The clocks can become misaligned due to uncertainties associated with wire delay, clock driver size and variations in process, voltage and temperature across the integrated circuit chip. As a result, the registers may interpret time indicated by the local clock signals ($\phi$ and $\phi'$ in FIG. 3A) differently. Consider the case when the clock signal for the second register is delayed, or "skewed," as shown in FIG. 3B. The late arriving rising edge of the delayed clock $\phi'$ postpones the sampling of the input of the second register.

FIG. 3B shows a signal labeled In, shown as a dashed line, which represents the input to the first register when the clock $\phi$ rises. At time $T_1$, the input has a high value. However, the input as provided to the second register at time $T_2$, the second rising edge of the clock signal $\phi'$(skewed) after one cycle, may have an erroneous low value when provided to the second register if skew exists between clocks $\phi$ and $\phi'$.

If the time to propagate the output of the first register to the input of the second register is smaller than the clock skew, the value of the input at time $T_1$ may be overwritten prior to time $T_2$ at the second register. Overwriting the value is due to the falling input at the first register which is sampled on the earlier rising edge of clock $\phi$ and propagated to the second register prior to $T_2$. Consequently, the second register already contains the low value at time $T_2$, when the input for register 2 is sampled. This causes the output to change prematurely, as shown in FIG. 3C, which shows the correct output Out and the erroneous output Out'. The signal Out' has a low value at the rising edge $T_2$ of the clock instead of a high value.

Differences in clock arrival times are an increasing concern for high-speed circuit designers. Cycle times have been dramatically decreasing, driven by faster transistors and by more aggressive designs that use fewer gates per cycle. Differences in clock arrival times are increased by variables such as process variations, environmental variations, wire delay and clock loading. With decreasing clock cycle times, clock skew is consuming an increasing fraction of the cycle time and less time is available to perform logic operations. Therefore, designers have been forced to pay increasing attention to clock skew.

Conventional tools for static timing analysis, including commercially available static timing analysis tools, allow for a delay to be introduced for each clock and a single uncertainty skew value that applies to all domains of the circuit. However, uncertainty can be introduced by a number of variables, each having a different skew value, as described above. In such cases, static timing analysis with a single uncertainty skew value is insufficient. Furthermore, a given integrated circuit may include a large number of "domains" that are affected differently by clock skew. A designer may wish to eliminate clock skew in a critical path for the circuit, and/or to design the circuit and clock network to include less clock skew between nearby modules than between modules farther apart. What is needed is a more accurate means to consider clock skew in the design of high-performance digital systems.

SUMMARY OF THE INVENTION

In accordance with the present invention, a method for considering clock skew in designing digital systems is provided. The disclosure teaches a method for determining whether logic operations can be performed within the available time and allows detailed modeling of clock skew. The method models skew by taking into account both systematic variation in clock arrival time and "jitter," which includes the temporal variation in clock arrival time due to variables such as process, temperature and voltage fluctuations. The method can be implemented using a software application. A design of an integrated circuit can be revised or verified using the method taught. The disclosure envisions that integrated circuits, printed circuit boards, computer systems and other components will be manufactured based upon designs developed with the method taught.

In one embodiment, a method includes selecting a domain from multiple domains representing an integrated circuit, wherein each domain has a respective clock delay. The method further includes determining a respective skew delay relative to the selected domain for each domain. The method also includes adding the respective skew delay to the respective clock delay to form a respective sum relative to the selected domain for each domain. The respective sums model clock skew relative to the selected domain. The method is repeated for each domain.

The method can include determining whether a path originating in an originating domain of the domains and terminating in the selected domain has a timing violation using the respective sum for the originating domain relative to the selected domain. The respective skew delay relative to the selected domain for each domain corresponds to one of several clock skew values that can be determined by an administrator; for example, the administrator may choose to model local, regional and global skew or any number of skew value groupings.

In one embodiment, determining the respective skew delay for each domain relative to the selected domain involves selecting the respective skew delay from a clock skew matrix. The selected domain and the given domain indicate the row and column from which the respective skew delay is to be selected.

One embodiment includes determining top paths for each selected domain. Top paths are determined by calculating a respective slack value for each path terminating in the selected domain, selecting largest timing violations from the respective slack values for each path. Each path having one of the plurality of largest timing violations is a top path.

The invention also includes a system, computer program product, and computer system designed to implement the methods described above.

The disclosure contains, by necessity, simplifications, generalizations and omissions of detail; consequently, those skilled in the art will appreciate that the disclosure is illustrative only and is not intended in any way to be limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 5A shows a two dimensional clock skew matrix. Each position in the matrix represents the potential clock skew between domains of the clock network. FIG. 5B shows an equivalent clock skew matrix in which the skews between the various domains of the clock network are represented by categories.

FIG. 6A and FIG. 6B show the concept of a "sliding window" approach to account for multiple clock skew values during static timing analysis. Specifically, FIG. 6A shows a clock skew window for analysis of timing paths contained in or terminating in region 54. FIG. 6B shows the clock skew window for analysis of region 55.

DETAILED DESCRIPTION

Figure 1A:
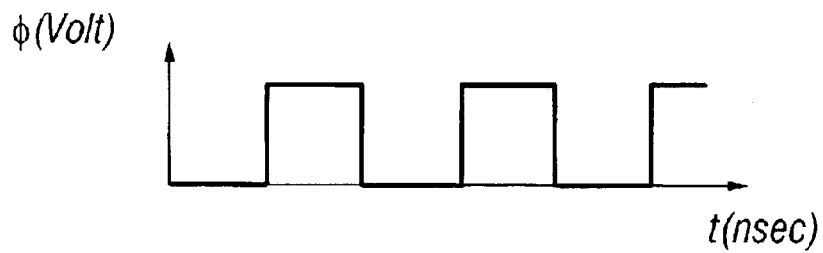
FIG. 1A shows an idealized clock waveform.
Figure 1B:
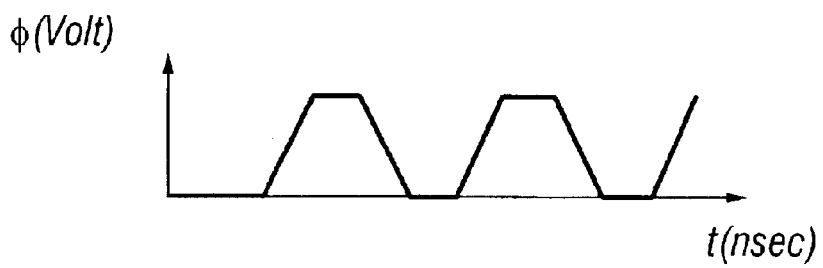
FIG. 1B shows a clock waveform which is not ideal.
Figure 1C:
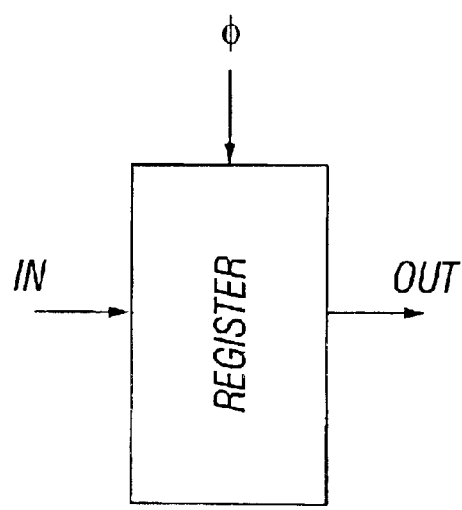
FIG. 1C shows a register module and its connections.
Figure 2A:
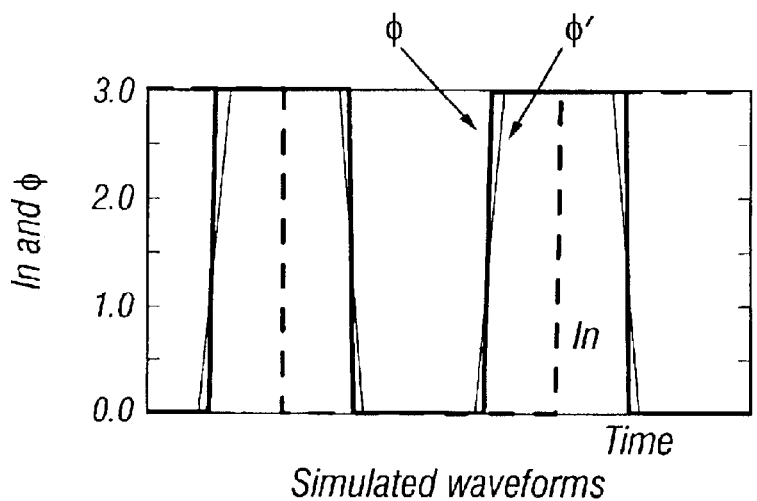
FIG. 2A shows the input of a register module.
Figure 2B:
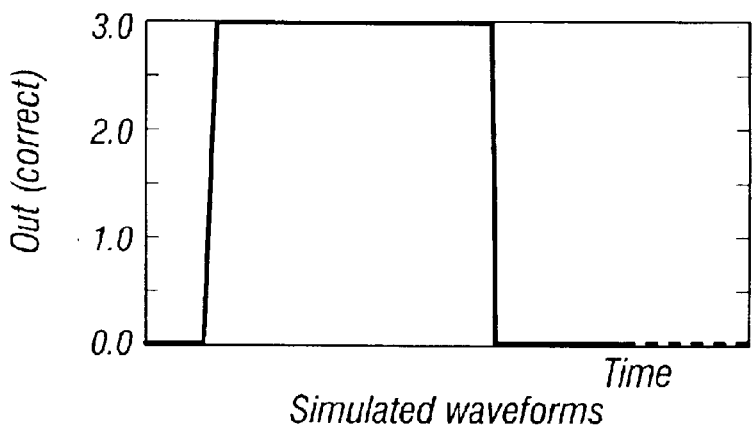
FIG. 2B shows the output of a register module when clock slew is within acceptable limits.
Figure 2C:
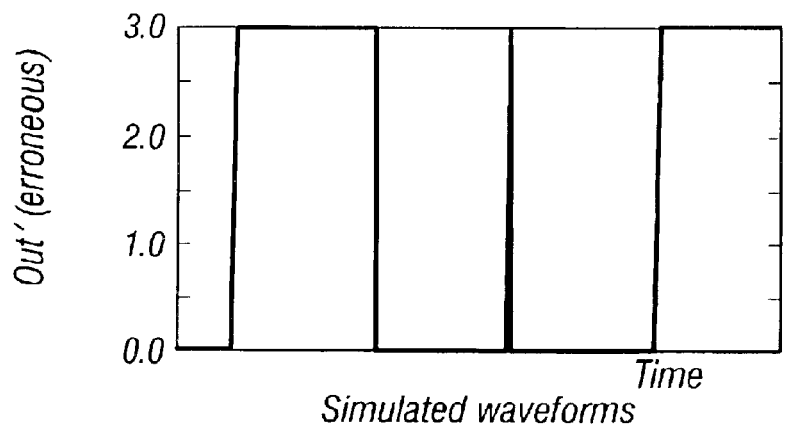
FIG. 2C shows the erroneous output (represented as Out') of a register module when clock slew exceeds acceptable limits.
Figure 3A:
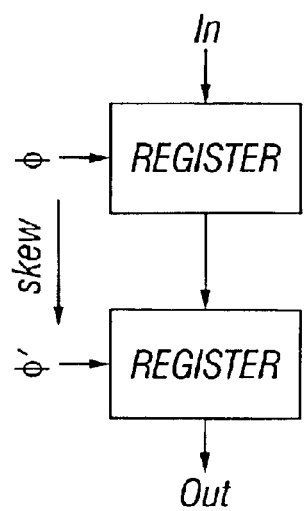
FIG. 3A shows two cascaded registers.
Figure 3B:
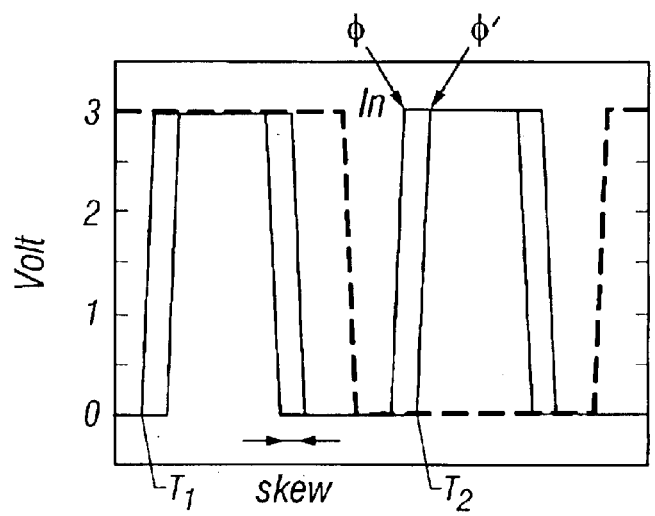
FIG. 3B shows input signals to the first register.
Figure 3C:
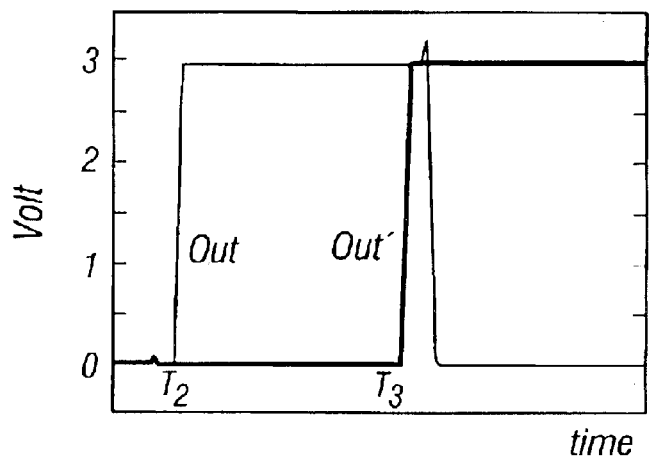
FIG. 3C shows both correct and erroneous output signals from the second register.
Figure 4A:
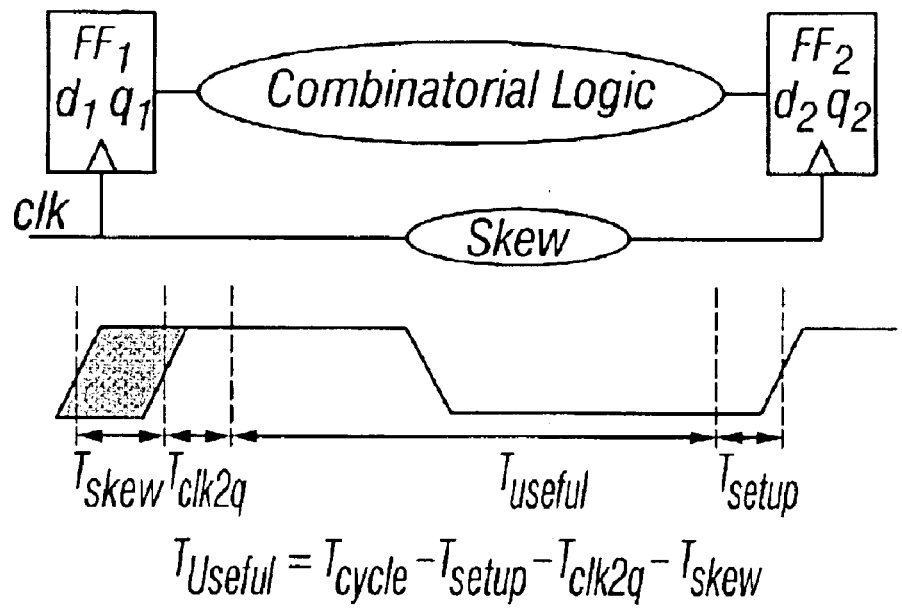
FIG. 4A shows a representation of "useful" time ($T_{useful}$) in a clock cycle for a design with flip-flop (edge-sensitive) registers.

The following sets forth a detailed description of a mode for carrying out the invention. The description is intended to be illustrative of the invention and should not be taken to be limiting. A method is taught for determining whether the design of a digital circuit is compatible with a clock design and specified operating frequency ("cycle time"). The method considers the paths of electrical signals through the circuit. Each path for a signal has a source domain and a target domain. The method determines if a logic function (or combination of logic functions, collectively referred to as "combinatorial logic") along the path can be completed in a given clock cycle. Timing violations found in paths for each possible source- and target-domain combination are used to identify areas in the design that may need to be adjusted to provide additional time for logic functions. Referring to FIG. 4A, $T_{useful}$ can be defined as the maximum time available to perform logic functions. When the time required to actually complete a logic function ($T_{logic}$) is greater than the time available ($T_{useful}$, as limited by the clock cycle and clock skew), logical and/or operational errors can result. A logical error can produce an incorrect result in a software application or cause a computer system to shutdown without a command (a "crash"). Thus, static timing analysis is essentially the process of comparing actual logic delays ($T_{logic}$) to "$T_{useful}$" as defined in Equation 1 below.

$$T_{useful} = n*T_{cycle} - T_{setup} - T_{clk2q} - T_{skew} \quad \text{Equation 1}$$

Where:

$T_{useful}$ represents the time available to complete a logic function;

$T_{cycle}$ represents the clock cycle time;

n represents a multiplier determined according to an intended number of cycles for the logic to complete;

$T_{setup}$ represents the time required for a signal to arrive before a capturing clock edge;

$T_{clk2q}$ represents the time required for the output of a register to stabilize after the clock switches;

$T_{skew}$ represents clock skew;

$T_{logic}$ represents the time required to actually perform the logic function; and $T_{slack} = T_{useful} - T_{logic}$, which is a positive value if the path allows sufficient time to perform logic operations and negative if the path does not allow sufficient time to perform the logic operations.

Equation 1 shows that as $T_{skew}$ increases, $T_{useful}$ decreases. One way to maintain $T_{useful}$ as $T_{skew}$ increases is to increase $T_{cycle}$. Increasing $T_{cycle}$, decreases the operating speed of a computer, which is an undesirable result. Rather than increase $T_{cycle}$, the method of the present invention enables a designer to evaluate whether a given clock design allows sufficient time for logical functions to be performed by the integrated circuit. In other words, as $T_{skew}$ increases, $T_{logic}$ can be decreased to maintain a constant $T_{cycle}$. Adjustments in the clock network design and/or the arrangement of the logical functions can be made to ensure that sufficient time is available for all logic operations to be performed by the integrated circuit.

A register within the integrated circuit can be a flip-flop or latch. As shown in FIG. 4A, the input and output pins of flip-flop registers are denoted as "d" and "q". Flip-flop FF1 has associated input $d_1$ and output $q_1$, and flip-flop FF2 has associated input $d_2$ and output $q_2$. The time from the enabling edge of the clock until data become available at the output (i.e., clk to $q_1$) is denoted as $T_{clk2q}$. Flip-flops open at the enabling edge, either the rising edge or the falling edge, of the clock. (Sometimes it is said that flip-flops are "edge sensitive.") For a circuit to operate properly, data must arrive at the flip-flop a certain amount of time (referred to as setup time, or $T_{setup}$) before the clock edge. Thus, if data arrive before the clock edge rises (or falls), the data wait until the clock edge rises (or falls) and the gate is open.

Each flip-flop starts a new timing path. A row of flip-flops (where the first flip-flop is denoted as FF1) can be defined as FF1→FF2→FF3→FF4 (read as flip-flop one to flip-flop two, etc.) The first path is FF1→FF2. When data in the first timing path arrive within the time calculated as $T_{useful} = T_{cycle} - T_{setup} - T_{clk2q} - T_{skew}$, the first timing path "meets timing" at FF2. If the first timing path does not meet timing, a violation has occurred and insufficient time is available for logic operations between FF1 and FF2 (i.e., $T_{slack}$ is negative). Whether or not the first data path meets timing, the second path (from FF2→FF3) is evaluated separately. The second timing path can meet timing, even if the first timing path does not.

The end of each flip-flop to flip-flop path (i.e., FF1→FF2) involves a synchronization point (also referred to as a "sync point"). Data must be waiting at the input of each flip-flop far enough in advance to be properly propagated when the (possibly skewed) enabling clock edge arrives. In order to minimize this "dead" time, the amount of logic between each pair of flip-flops must be carefully balanced. Additionally, a clock skew penalty must be allowed for in the design at each sync point.

Figure 4B:
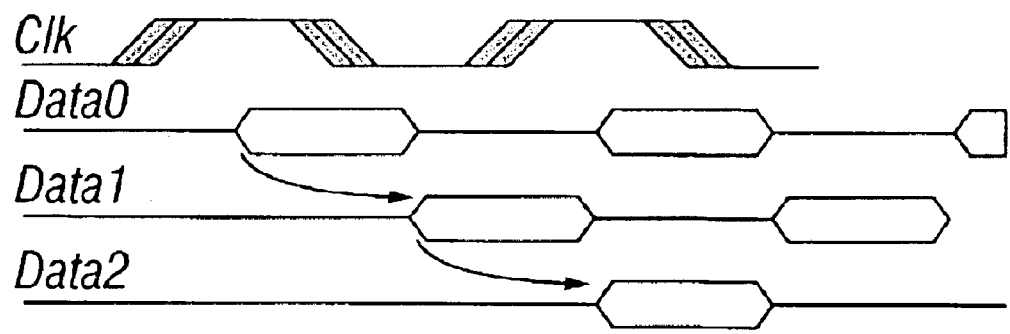
FIG. 4B shows data flowing through registers which are level sensitive (also referred to as "latches").

An alternative circuit design may use level-sensitive registers ("latches") instead of edge-sensitive registers (flip-flops). FIG. 4B is a plot of data flow versus a clock signal in a design based on latches. Data may flow transparently through latches. The difference between a flip-flop design and a latch design is similar to the difference between a stop sign and a traffic light. A car must stop at every stop sign just as a electrical signal in a digital circuit must stop at every flip-flop. A car may stop at a red traffic light or proceed through the intersection if the light is green. Similarly, an electrical signal may stop at a latch if it is closed or proceed through if the latch is transparent.

Unlike flip-flops, latches are level sensitive. Some latches are transparent when the clock is high (hereinafter referred to as an "A-latch"). Some latches are transparent when the clock is low (hereinafter referred to as a "B-latch"). If data arrive at an A-latch before the rising edge of the clock, then the data are available at the output (q) at time $T_{CLKrise} + T_{clk2q}$ (where $T_{CLKrise}$ is the arrival time of the rising edge of the clock). This A-latch is called a sync point because data waits for the clock. (In this case, the A-latch operates like a flip-flop described in the preceding paragraph.) However, if data come after the rising edge but before the falling edge, then output is available at $T_{data} + T_{d2q}$ ($T_{data}$ is the arrival time of the data). In this case the latch is referred to as a "flow-through" or "transparent" latch.

When a signal reaches a given destination in a latch-controlled circuit, the latch originating the signal cannot be definitively determined. The signal may have "flowed through" one or more intermediate flow-through latches in its path from the originating latch to the destination. Because the originating source latch may be physically located far away from the destination, additional skew may have been introduced in the path from the source to the destination and should be accounted for in a timing analysis.

A design based on flip-flops can be analyzed considering detailed clock skew effects by post-processing a timing report produced by static timing analysis if the static timing does not remove (or prune) sub-critical paths. A sub-critical path is a path terminating at a particular register which has a larger slack than another path terminating at the same end point. A timing report includes a calculation for each path in the circuit indicating the source, destination and timing slack ($T_{slack}$). The timing slack is positive if the path has sufficient time to perform logic operations and reflects slack available for performing additional logic operations. If the timing slack is zero, the path meets timing. If the timing slack is negative, the path violates timing and the design should be adjusted to allow additional time for logic operations.

Post-processing of the timing report can be used for flip-flop based designs because, without the presence of flow-through latches and path pruning, the source and destination of the worst-case timing paths can be identified. Knowing the source and destination of the path enables the skew for the path to be determined, for example, using the relative positions of the source and destination domains. This clock skew value can be looked up in a clock skew matrix, such as the skew matrices of FIGS. 5A and 5B, discussed in further detail below.

However, in a design based on latches, the timing report cannot be post-processed because different skew values in different domains must be taken into account. Path pruning is required due to the additional complexity of data flow through transparent latches. Unlike a flip-flop based design, the source and destination of the worst case timing paths are not known a priori due to the complication of latch transparency which depends upon the data and clock delays in the design. Thus, it has previously not been possible to associate a clock skew value with each path in a latch-based circuit to determine the worst case timing path. The present invention performs a timing analysis for each domain, taking skew relevant to the particular domain into account in determining the worst-case timing paths. The present invention enables skew to be considered for circuit designs based on either flip-flops or latches, as well as for circuits including a combination of flip-flops and latches.

As noted above, typical static timing analysis of a circuit uses a single clock skew value to determine worst-case timing violations and does not take variations in clock skew into account. In order to represent variations in clock skew from a variety of different sources, the present invention uses a clock skew matrix as illustrated in FIG. 5A.

FIG. 5A shows a two-dimensional matrix representing clock skew between blocks in a circuit. Each position in the matrix, designated as an S with a subscript, represents the relative clock skew between blocks. A skew matrix can be used to identify the clock skew between the "driving" and "receiving" registers associated with sending and receiving blocks of the integrated circuit.

A block may correspond to a clock domain based on the design of a specific integrated circuit and the associated clock network. The following discussion assumes that a block corresponds to a clock domain, although the invention is not limited to such a requirement.

In the clock skew matrix of FIG. 5A, the total number of blocks is represented by the variable T, and each dimension of the matrix has T blocks. The first number in the subscript for a particular entry in the matrix represents a first block (or a register within the first block) of an originator of a signal, and the second number in the subscript represents a second block (or a register within the second block) in which the signal terminates. The value of the first row and the first column of the matrix (represented by "$S_{11}$" in FIG. 5A) represents the clock skew within block 1, also referred to as "local skew" for block 1. The value of the second column in the first row (represented by "$S_{12}$" in FIG. 5A) represents the clock skew for a signal originating in block 1 and terminating in block 2. Continuing with the illustrative example, the first column of the Nth row (represented by "$S_{N1}$" in FIG. 5A) represents the clock skew for a signal originating in block N and terminating in block 1. And finally, the clock skew within the last block T is represented by $S_{TT}$.

The values in the clock skew matrix represent skew between the two blocks, calculated taking into account variables such as process variations, environmental variations, wire delay and clock loading, as appropriate for the circuit being designed. One of skill in the art would be capable of determining skew values to complete a similar matrix appropriate for a particular circuit of interest.

Completing the clock skew matrix involves selecting a particular domain and calculating skew values for all paths terminating in that domain. Each domain is selected, until the values in the clock skew matrix are calculated for all domains.

After determining the value of each clock skew in the matrix represented by FIG. 5A, the clock skew values can be grouped into categories, although such groupings are not required for operation of the invention. The number of groups can vary and can depend on the accuracy required of a subsequent calculation. Groups with different categories and different numbers of categories are possible, as appropriate for the circuit being designed.

FIG. 5B shows a matrix in which the relative clock skew between driving registers and receiving registers for two blocks is represented by a global, regional or local category, denoted by "G", "R" and "L", respectively. For example, in the first row and the first column of the matrix shown in FIG. 5B, an "L" replaces $S_{11}$ (as previously shown in FIG. 5A). Often, local skew has a value of zero. Both positive and negative values for skew are possible. The second column of the first row (previously shown as $S_{12}$ in FIG. 5A) contains an "R". Thus, the second column of the first row of FIG. 5B represents regional skew for signals originating in block 1 and terminating in block 2. In some skew matrices, a skew value $S_{ij}$ will be equal to the skew value of its symmetric counterpart $S_{ji}$, but such equivalence is not required. In FIG. 5B, a regional skew is greater than a local skew. The fourth column of the first row of the matrix shown in FIG. 5B contains a "G". This "G" indicates that global skew exists between the first block and the fourth block. In this example, a global skew value is higher than either a regional skew value or a local skew value.

The skew category (global, regional, or local) can be related to the radial distance between registers, or clock skew may be based upon the specific location of registers relative to other clock network or chip features. Depending upon the structure of the clock network, adjacent blocks can have a skew larger than a local (or regional) skew. The categories can be chosen to accurately reflect a clock network for a specific design and the desired accuracy of skew modeling.

A separate timing analysis, referred to as a "timing run," models one or more entries in a clock skew matrix. Completing the timing analysis for the entire circuit requires at most one timing run per clock skew domain. In some embodiments, a timing run models an entire row or column of the clock skew matrix. The clock skew matrix provides a measure of uncertainty (skew) between each pair of launching and receiving clock signals.

The timing analysis finds critical paths which terminate in a specific domain (such as domain 54, which is discussed in greater detail below). A critical path corresponds to a path terminating in the domain of interest and having a timing violation.

The squares of the grids in FIGS. 6A and 6B are consecutively numbered from one to T, where T is a number of clock domains in a clock network corresponding to the integrated circuit being designed. For purposes of the following discussion, a clock domain corresponds to a block of the integrated circuit. In the example shown in FIG. 6A and FIG. 6B, the grid contains one square for each block.

In both FIGS. 6A and 6B, one row includes domains labeled 34, 35 and 36. Another row is shown with domains labeled 43, 44, 45, 46 and 47. A third row is shown with domains labeled 52, 53, 54, 55, 56, 57 and 58. Any domain of interest in the integrated circuit being designed can be selected and a timing analysis performed for the selected domain.

FIG. 6A shows a grid for domain 54 as an illustrative example. Any timing path having controlling clock signals that originate and terminate within block 54 can be defined as having a local skew (even though the signals may pass through other blocks between the origination and the termination). Local skew values can be determined using a single skew value, such as zero, in a timing analysis. As shown in FIG. 6A, the skew between domain 54 and domains 34, 43, 44; 45, 52, 53, 55, 56, 63, 64, 65 and 74 corresponds to regional skew. Relative to domain 54, any domain outside the local and regional areas exhibits a global skew. The skew values corresponding to each square in the grid correspond to skew values in a clock skew matrix. For example, the skew values shown in the grid correspond to values in, for example, a column of a clock skew matrix representing domain 54.

After completing the normal static timing analysis using a single skew value for a domain of interest, another block of interest can be similarly analyzed, as shown in FIG. 6B. Specifically, in FIG. 6B the block of interest is changed to block 55 and clock skew values are calculated with respect to block 55. Note that the skew values with reference to domain 55 are different than those of FIG. 6A with reference to domain 54.

The results of this analysis include modeling of the $55^{th}$ column of a clock skew matrix. The process can be repeated until each block in the integrated circuit has been analyzed, thus completing the clock skew matrix analysis. Alternatively, for efficiency, only certain blocks can be analyzed.

The relative differences in clock skew values, as represented by the categories, are used to determine relative initiation times for signals flowing through the circuit. These relative initiation times for signals are illustrated in FIGS. 7 and 8.

Figure 7:
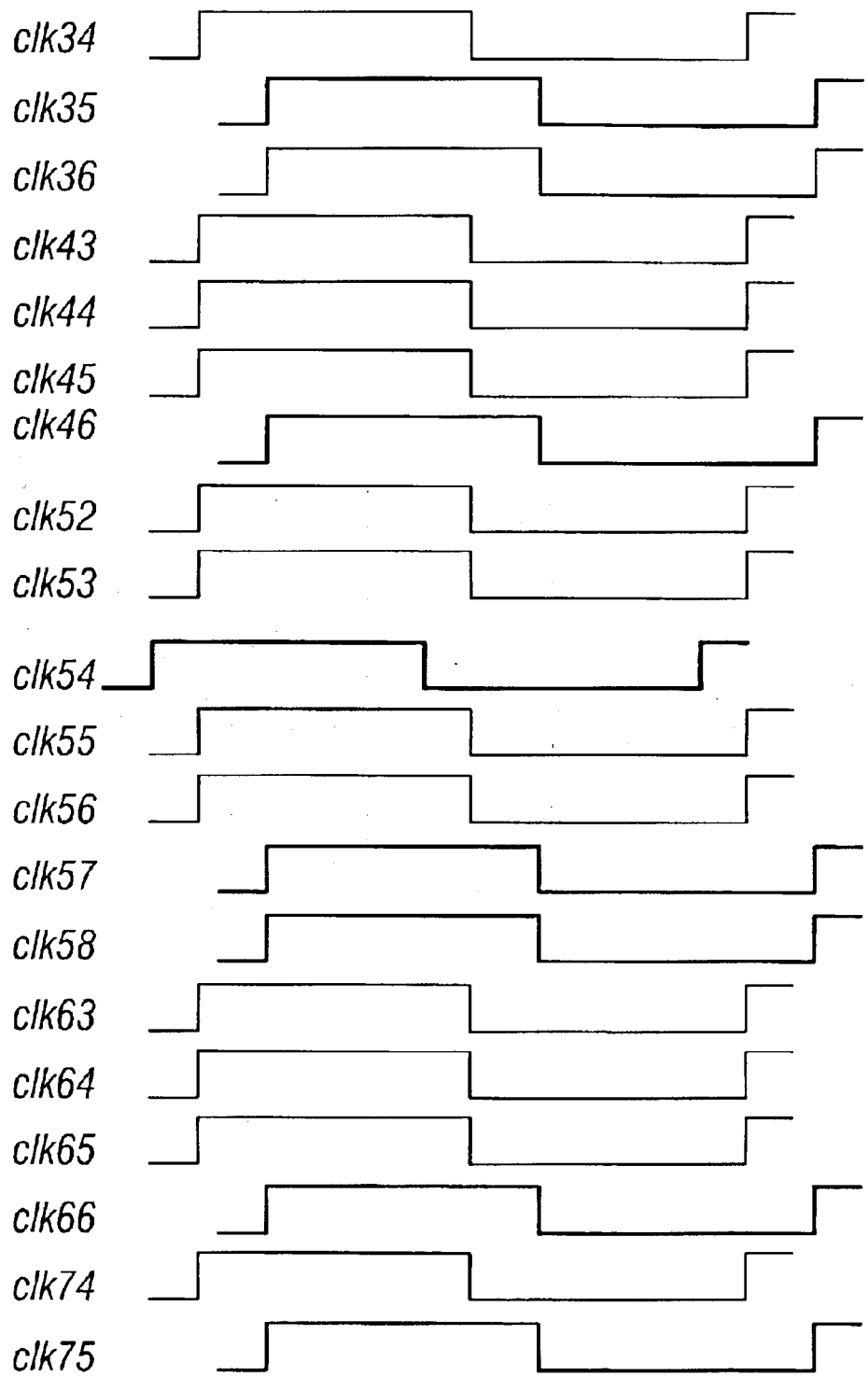
FIG. 7 shows an example representation of clock waveforms in various domains of the clock network to perform static timing analysis of a specific domain (domain 54).

FIG. 7 shows an example representation of clock waveforms in various domains of the clock network to perform the static timing analysis of domain 54. In this example, the skews are assumed to be positive, but in other analyses, the values might be negative.

A signal originating and terminating within a domain can be considered to have local skew and can be assigned a "base" initiation time. For example, the clock waveform for domain 55 shows that the clock arrives late in this domain by an amount equal to "regional" skew. Similarly, the clock waveform for domain 57 shows that the clock arrives late in this domain by an amount equal to "global" skew. These skew values can be introduced into the static timing analysis as an added delay in the clock network.

Figure 8:
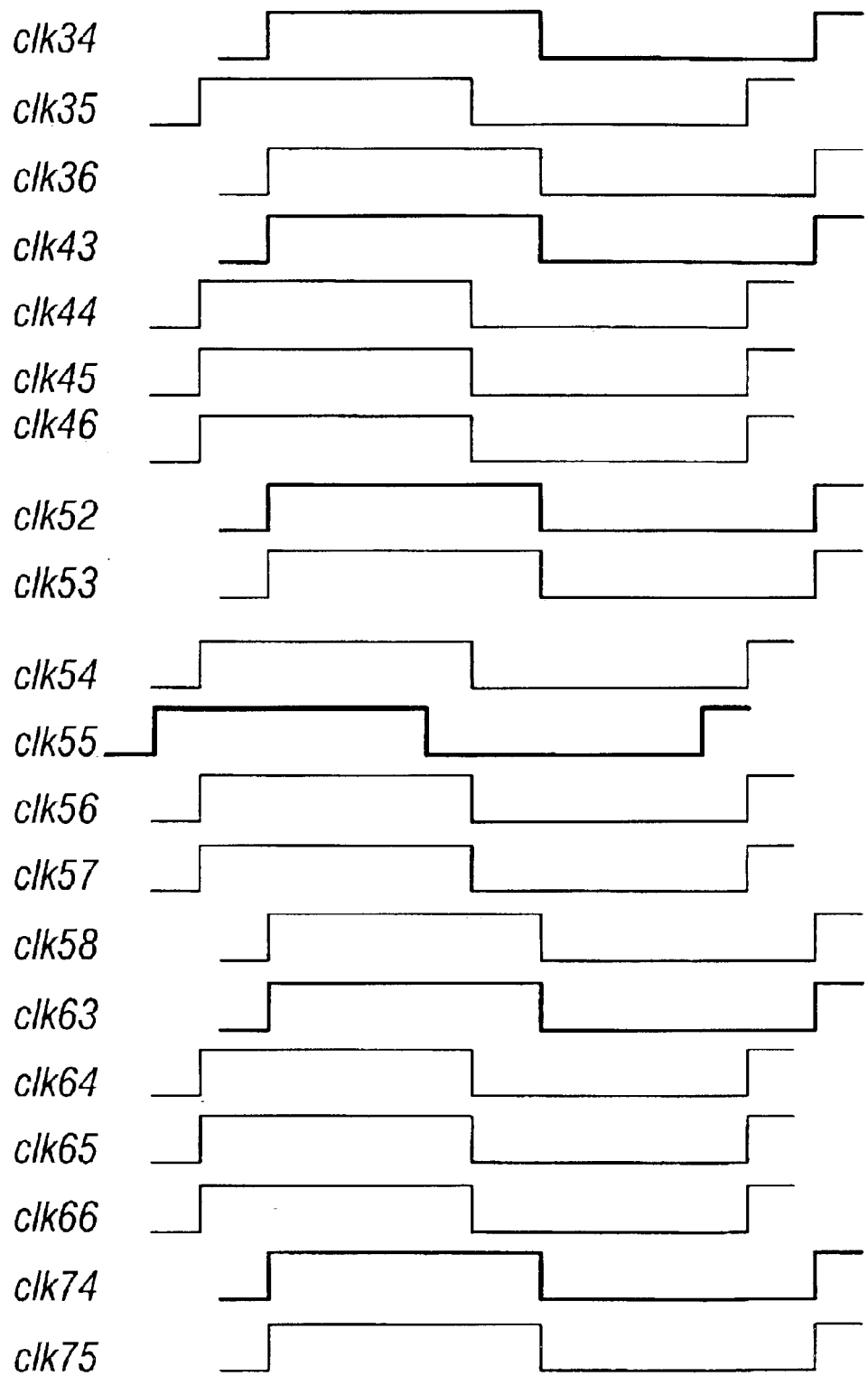
FIG. 8 shows an example representation of clock waveforms in various domains of the clock network to perform static timing analysis of another domain of interest (domain 55).

FIG. 8 shows an example representation of clock waveforms in various domains of the clock network to perform static timing analysis of another domain of interest, domain 55. The clock waveform for domain 56 shows the clock is arriving late in this domain by an amount equal to "regional" skew. Similarly, the clock waveform for domain 58 shows the clock arriving late in this domain by an amount equal to "global" skew.

To account for these relative differences in clock arrival times, the present invention includes inserting an artificial "clock delay network" into the circuit prior to static timing analysis to add delay to the clocks in the appropriate domains. For example, referring to FIG. 7, a signal that originates and terminates within domain 54 has a delay corresponding to local skew. A signal that originates in domain 55 and terminates in domain 54 is delayed by launching it at the late clock edge corresponding to "regional" skew. A signal that originates in domain 57 and terminates in domain 54 is delayed by launching it at the late clock edge corresponding to "global" skew. These added clock delays are provided to the static timing analysis tool to account for the variations that produce regional and global skew.

Once the clock network is "revised" to introduce these additional delays, standard timing analysis can be performed on the circuit. This standard timing analysis may include using a single skew value, although a value of zero for skew may also be used. Timing analysis is performed for each domain of interest, such as domain 54, to determine the timing violations in each domain. A largest violation is determined for each domain and for each register in the domain to identify an area of the circuit design in which insufficient time is available to perform the desired logic operations. The design of the paths terminating in that domain can be revised to allow additional time or to shift logical operations to another part of the design.

Figure 9A:
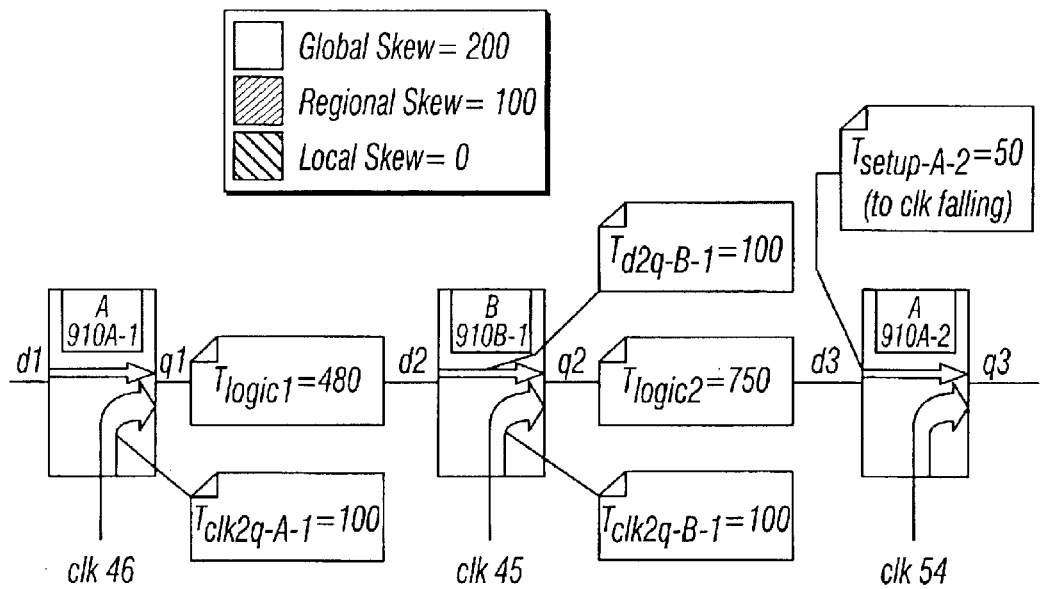
FIG. 9 shows an example of a timing analysis performed in the presence of multiple clock skew domains corresponding to a timing critical path terminating in a specific domain (domain 54).

FIG. 9A shows an example of a timing analysis performed in the presence of clock skew domains as represented in FIG. 6A. The circuit consists of an A-latch 910A-1 in domain 46, a B-latch 910B-1 in domain 45, and a receiving A-latch 910A-2 in domain 54. As mentioned previously, an A-latch is transparent when the clock is high, and a B-latch is transparent when the clock is low. The circuit also includes combinatorial paths connecting these latches (represented as combinatorial logic $T_{logic1}$ and $T_{logic2}$).

Figure 9B:
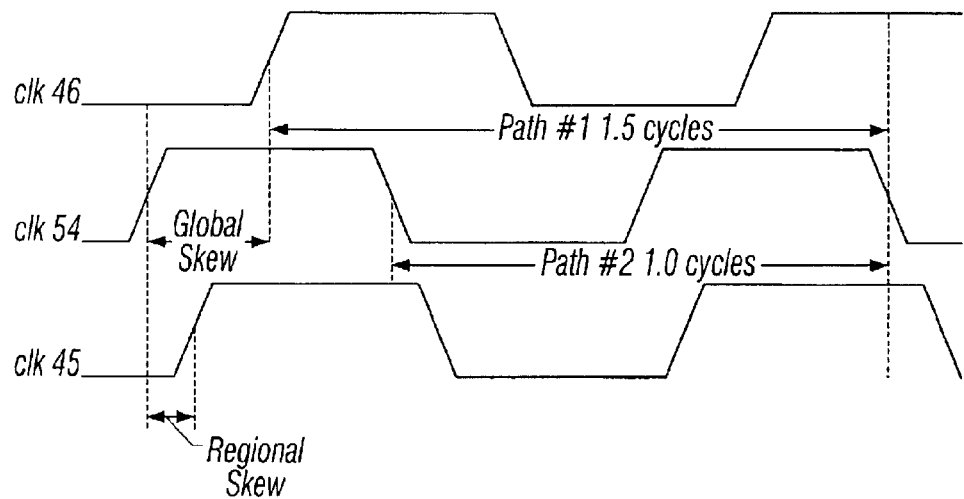

As shown in the waveforms in FIG. 9B, with respect to domain 54, domain 46 has global skew, and domain 45 has regional skew. Assume the target clock cycle time ($T_{cycle}$) is 1000. Global, regional and local skew values are 200, 100 and 0 respectively. Referring again to FIG. 9A, consider two potential paths terminating at A-latch 910A-2 in domain 54:

Path #1 clk46 rising→clk54 falling (1.5 cycles) and

Path #2 clk45 falling→clk54 falling (1 cycle).

Path #1 requires 1.5 cycles, from clk46 rising to clk54 rising (1 cycle) and from clk54 rising to clk54 falling (0.5 cycle). Path #2 requires 1 cycle, from clk45 falling to clk54 falling. In a single skew analysis, without adding values to adjust for clock skew, Path #2 would be chosen as the worst case path:

Path #1 $T_{arrival\text{-}q2}=T_{clk46^\wedge}+T_{logic1}+T_{d2q\text{-}B\text{-}1}=0+100=580$ and Path #2 $T_{arrival\text{-}q2}=T_{clk45v}+T_{clk2q\text{-}B\text{-}1}=500+100=600$←worst path/ single skew analysis To illustrate how the invention handles multiple clock skew domains, consider the time at which data arrive at q2 (the output of B-latch 910B-1) to determine which of these paths is the most critical. In a standard timing analysis, the other path will typically be pruned and not reported. The analysis of arrival time at q2 ($T_{arrival}$) proceeds as follows:

Path #1 $T_{arrival\text{-}2}=T_{clk46^\wedge}+\text{"Global Skew"}+T_{logic1}+T_{d2q\text{-}B\text{-}1}=0+200+480+100=780$←worst path when clock skew is taken into account Path #2 $T_{arrival\text{-}q2}=T_{clk45v}+\text{"Regional Skew"}+T_{clk2q\text{-}B\text{-}1}=500+100+100=700$ where:

$T_{clk46^\wedge}$ is the nominal rising edge of the clock at T=0 and $T_{clk45v}$ is the nominal falling edge of the clock at T=500. This example shows how the addition of the skews to the nominal clock arrival times allows the timing analysis to determine that the correct worst case path is Path #1. This worst case path can be determined even at the intermediate point $q_2$ where information about the ultimate end of the path may not be available during timing analysis.

Figure 10:
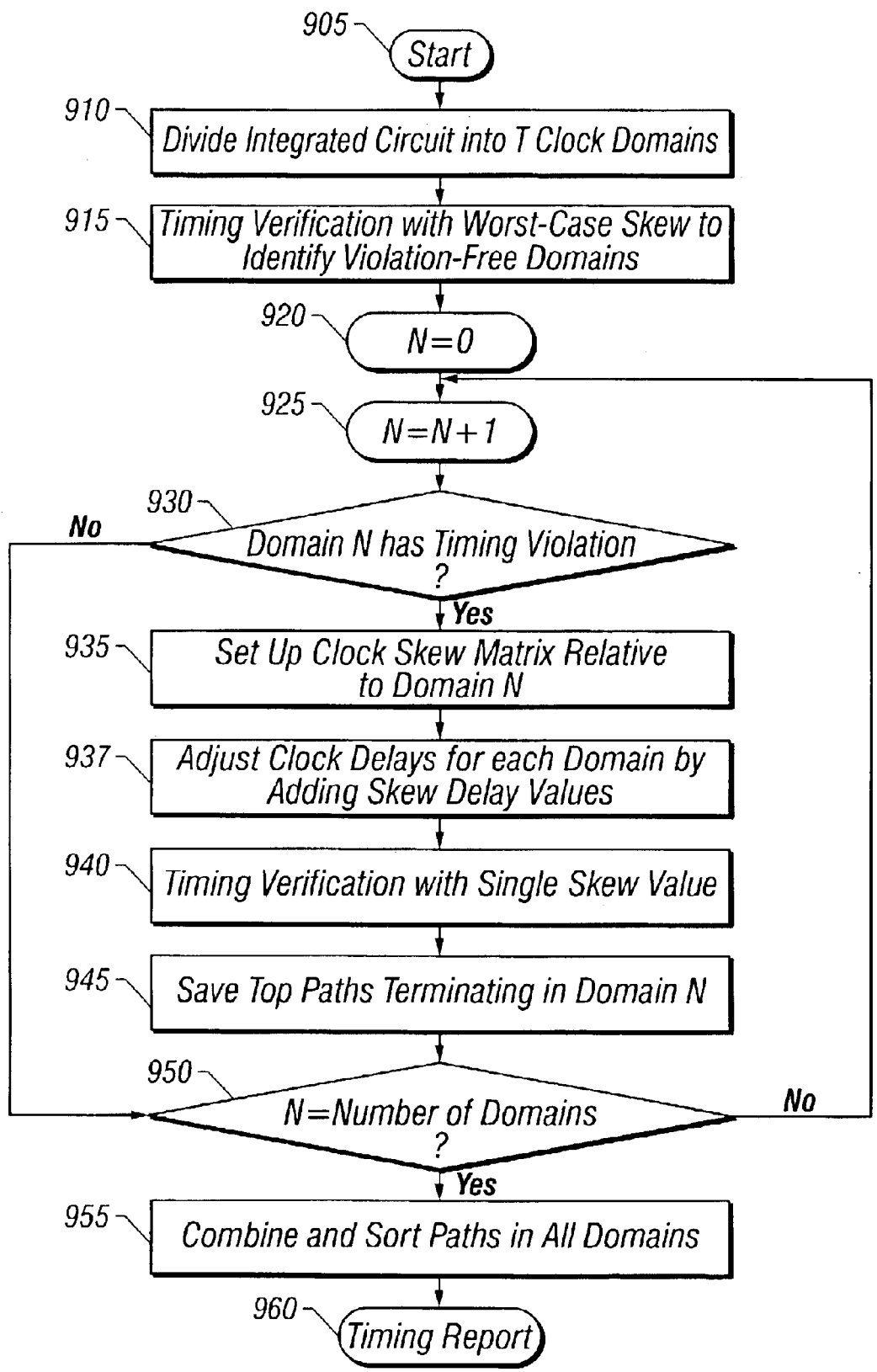
FIG. 10 shows a flow diagram of a method considering clock skew in digital systems.

FIG. 10 shows a flow diagram pertaining to the method taught. The method begins at "Divide Integrated Circuit into T Clock Domains" step 910. A subset of domains for the circuit may be selected for further processing at this point.

The method then proceeds to "Timing Verification with Worst-Case Skew to Identify Violation-Free Domains" step 915, which is an optional step to improve efficiency. In this embodiment, timing analysis is initially performed using the worst case clock skew to eliminate domains from consideration which have no timing violations. No further timing analysis is necessary for these domains. For example, in one embodiment, timing verification is performed with worst-case global skews. This timing analysis may be performed using a commercially available static analysis timing tool, such as PrimeTime®, a full-chip, gate-level, static timing analysis tool supporting system-on-a-chip design provided by Synopsys, Inc. Another example of a commercially available static timing analysis tool is Pearl®, provided by Cadence Design Systems. Other embodiments may use an alternative way to eliminate domains from further analysis, or may analyze each domain.

The method proceeds from "Timing Verification with Worst-Case Skew to "Identify Violation-Free Domains," step 915 to "N=0" step 920. "N=0" step 920 initiates a logical counter N for domains. The method proceeds to "N=N+1" step 925, which increments the variable N and selects one of the domains for timing analysis. The selection of a domain can be performed by a domain-selecting module, instructions, and/or means of a system designed to implement the method. The method proceeds to "Domain N has Timing Violation" decision point 930, which determines whether the domain corresponding to the value of counter N has timing violations. If the domain of interest has no timing violations, then the method proceeds to "N=Number of Domains" decision point 950.

If the domain of interest has timing violations at "Domain N has Timing Violation" decision point 930, the method proceeds to "Set Up Clock Skew Matrix Relative to Domain N" step 935 to set up a row or column of a clock skew matrix relative to the domain of interest. A clock skew delay value is calculated for each domain relative to domain N, as described above, to complete a respective row or column of the clock skew matrix. These clock skew values can be determined by a skew-delay determining module, instructions, and/or means of a system designed to implement the method.

As described above, the values in the clock skew matrix can be assigned to categories, where a category corresponds to an amount of added delay introduced into the clock network to model skew.

The method proceeds to "Adjust Clock Delays for Each Domain by Adding Skew Delay Values" step 937 to introduce delays in the clock network to model the effect of skew on clock arrival times. Depending upon a category into which the clock skew value falls, a skew delay value is added to a clock delay for each domain relative to domain N. For example, if the clock skew value falls into a range for global skew, a different skew delay value will be added than for a clock skew value falling into a range for regional skew. This added delay may cause a path that would not otherwise have shown a timing violation to appear as a critical path violating timing. Adding skew delay values can be performed by an adding module, instructions, and/or means in a system designed to implement the method. Selecting skew delay values from a clock skew matrix can be performed by a skew-delay-selecting module, instructions, and/or means of a system designed to implement the method.

The method proceeds to "Timing Verification with a Single Skew Value" step 940. Having introduced delays to model skew, the single skew value timing analysis is performed on the integrated circuit, which models all domains. This timing analysis may be performed using a commercially available static analysis timing tool, such as PrimeTime®, provided by Synopsys, Inc., or Pearl®, provided by Cadence Design Systems. Alternatively, a static analysis timing tool may be written specifically to operate within a system designed to implement the method of the present invention.

The single skew value used may be, for example, zero or a value of a local skew, depending upon the nature of the circuit being analyzed. Skew values may be positive, zero, or negative depending upon the desired clock skew modeling and timing analysis.

Available processing times $T_{useful}$ for each path for all domains are determined and compared to an actual processing time $T_{logic}$ needed to perform the logic function provided by that respective domain of the circuit. To determine violations, a respective slack value is calculated for each path terminating in the selected domain. The calculation of a respective slack value can be performed by a calculating module, instructions, and/or means of a system designed to implement the method. Alternatively, calculation of slack values can be performed by the commercially available static timing analysis tools described above. Race conditions in the circuit may be evaluated to ensure that data are not prematurely overwritten. The determination of timing violations can be performed by a violation-determining module, instructions, and/or means of a system designed to implement the method, or by one of the commercially available static timing analysis tools mentioned above. Upon completion of the timing analysis, paths terminating in the domain of interest are selected from the timing report, as only those paths have been modeled with the appropriate skew values. A respective largest timing violation for a respective path terminating in the domain of interest can be identified. Alternatively, a set of respective largest timing violations for a set of respective paths terminating in the domain of interest can be identified.

Upon determining the respective largest violations for domain N, the method proceeds to "Save Top Paths Terminating in Domain N" step 945. "Save Top Paths Terminating in Domain N" step 945 saves timing information for the top paths terminating in domain N. These data are used later to produce a timing report. Top paths are those critical paths with the largest timing violations (negative slack).

The largest timing violations have the greatest difference between the time necessary to perform a logic operation and the available time. One or more timing violations can be selected in the top path analysis, and timing violations can be selected by a violation-selecting module, instructions, and/or means of a system designed to implement the method. Analysis of the circuit may include modifying the respective path for the domain to eliminate the respective largest timing violation. Top paths may need to be re-designed to allow sufficient time to perform the logic operations. Top paths may be determined by a top-path-determining module, instructions, and/or means of a system designed to implement the method.

At "N=Number of Domains" decision point 950, a determination is made whether the value of counter N equals T, the number of domains in the current design. If the counter is less than the number of domains in the current design, then the method returns to "N=N+1" step 925 to select another domain. If the value of the counter N is equal to T, timing analysis for all domains is complete and the method proceeds to "Combine and Sort Paths in All Domains" step 955.

"Combine and Sort Paths in All Domains" step 955 combines and sorts saved timing information for paths in all domains. "Combine and Sort Paths in All Domains" step 955 may eliminate paths which fall outside a group of domains of interest from the results of the individual timing runs performed. "Combine and Sort Paths in All Domains" step 955 combines the timing information for the remaining paths. In each static timing analysis for a particular domain of interest, timing violations may be reported which fall outside a group of domains of interest. The timing information for paths outside the group of domains of interest are discarded. From "Combine and Sort Paths in All Domains" step 955, the method proceeds to "Timing Report" step 960. "Timing Report" step 960 produces a timing report showing the timing information for paths having timing violations when differences in clock skew are correctly taken into account. In an embodiment, the violations can be ranked beginning with the largest violations. Combining and sorting timing information for paths in all domains to produce a timing report may be performed by a timing-report module, instructions, and/or means of a system designed to implement the method. This timing information may include timing violations and/or the respective slack values calculated as described above.

The method of the present invention can be used for a microprocessor having a plurality of blocks of any size. In one embodiment, the method is customized to analyze skew to reflect information specific to a particular clock network. In another embodiment, the method analyzes skew using parameters unique to a specific integrated circuit chip plan (sometimes called a "floorplan"). Other embodiments may combine these variables or use different variables.

The method disclosed can be implemented as a software application. The application is not restricted to a specific software package, language or architecture. Each of the steps of the method disclosed may be performed by a module (e.g., a software module) or a portion of a module executing on a computer system.

Operations discussed herein may include, for example, directly entered commands by a computer system user, steps executed by application specific hardware modules, steps executed by software modules, or combinations thereof.

The software discussed herein that performs the described steps may include script, batch or other executable files, or combinations and/or portions of such files. The software may include software code as well as data and may be encoded on computer-readable media. Additionally, those skilled in the art will recognize that the boundaries between software modules are merely illustrative and alternative embodiments may merge modules or impose an alternative decomposition of functionality of modules. Furthermore, those skilled in the art will recognize that the operations described herein are for illustration only. Operations may be combined or the functionality of the operations may be distributed in additional operations in accordance with the invention.

The operations described above may be executed on a computer system configured to execute the operations of the method and/or may be executed from computer-readable media. Such a computer system typically includes a processor for executing instructions and a memory for storing the instructions and is well-known to those skilled in the art. The method may be embodied in a machine-readable and/or computer-readable medium for configuring a computer system to execute the method. Alternatively, such actions may be embodied in the structure of circuitry that implements such functionality, such as the micro-code of a complex/reduced instruction set computer (CISC/RISC), firmware programmed into programmable or erasable/programmable devices, the configuration of a field-programmable gate array (FPGA), the design of a gate array or full-custom application-specific integrated circuit (ASIC), or the like.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims.

What is claimed is:

1. A method for analyzing an integrated circuit design, the method comprising:
   selecting a selected domain from a plurality of domains representing an integrated circuit, wherein
      each domain of the domains has a respective clock delay;
   determining a respective skew delay relative to the selected domain for each domain; and
   adding the respective skew delay to the respective clock delay to form a respective sum relative to the selected domain for each domain, wherein
      the respective sums model clock skew relative to the selected domain.

2. The method of claim 1 further comprising:
   determining whether a path originating in an originating domain of the domains and terminating in the selected domain has a timing violation using the respective sum for the originating domain relative to the selected domain.

3. The method of claim 2 further comprising:
   repeating the method of claim 2 for each domain of the domains;
   selecting timing violations for each path in each domain for a set of domains of interest;
   combining and sorting the timing violations to produce a timing report for the set of domains of interest.

4. The method of claim 1 wherein
   the respective skew delay relative to the selected domain for each domain corresponds to one value of a plurality of clock skew values.

5. The method of claim 1 further comprising:
   repeating the method of claim 1 for each domain of the domains.

6. The method of claim 1 wherein
   the determining the respective skew delay for each domain relative to the selected domain comprises:
      selecting the respective skew delay for each given domain from a clock skew matrix using the selected domain and the given domain.

7. The method of claim 1 further comprising:
   determining a plurality of top paths for the selected domain, the determining comprising:
      calculating a respective slack value for each path terminating in the selected domain; and
      selecting a plurality of largest timing violations from the respective slack values for each path, wherein
         each path having one of the plurality of largest timing violations is one of the plurality of top paths.

8. The method of claim 7 further comprising:
   repeating the method of claim 7 for each domain of a set of domains of interest;

combining the top paths for each domain of the set of domains of interest; and sorting the respective slack values for the set of domains of interest to produce a timing report for the set of domains of interest.

9. A system for analyzing an integrated circuit design, the system comprising:

domain-selecting means for selecting a selected domain from a plurality of domains representing an integrated circuit, wherein
each domain of the domains has a respective clock delay;

skew-delay-determining means for determining a respective skew delay relative to the selected domain for each domain; and adding means for adding the respective skew delay to the respective clock delay to form a respective sum relative to the selected domain for each domain, wherein
the respective sums model clock skew relative to the selected domain.

10. The system of claim 9 further comprising:

violation-determining means for determining whether a path originating in an originating domain of the domains and terminating in the selected domain has a timing violation using the respective sun=for the originating domain relative to the selected domain.

11. The system of claim 9 further comprising:

repeating means for repeating execution of the selecting means, the skew-delay-determining means, and the adding means for each domain of the domains.

12. The system of claim 9 wherein the skew-delay-determining means comprise:
skew-delay-selecting means for selecting the respective skew delay for each given domain from a clock skew matrix using the selected domain and the given domain.

13. The system of claim 9 further comprising:

top-path-determining means for determining a plurality of top paths for the selected domain;

calculating means for calculating a respective slack value for each path terminating in the selected domain; and violation-selecting means for selecting a plurality of largest timing violations from the respective slack values for each path, wherein
each path having one of the plurality of largest timing violations is one of the plurality of top paths.

14. A computer program product for analyzing an integrated circuit design, the computer program product comprising:

domain-selecting instructions to select a selected domain from a plurality of domains representing an integrated circuit, wherein
each domain of the domains has a respective clock delay;

skew-delay-determining instructions to determine a respective skew delay relative to the selected domain for each domain;

adding instructions to add the respective skew delay to the respective clock delay to form a respective sum relative to the selected domain for each domain, wherein
the respective sums model clock skew relative to the selected domain; and a computer-readable medium to store the domain-selecting instructions, the skew-delay-determining instructions, and the adding instructions.

15. The computer program product of claim 14 further comprising:

violation-determining instructions to determine whether a path originating in an originating domain of the domains and terminating in the selected domain has a timing violation using the respective sum for the originating domain relative to the selected domain, wherein the computer-readable medium further stores the violation-determining instructions.

16. The computer program product of claim 14 further comprising:

repeating instructions to repeat execution of the selecting instructions, the skew-delay determining instructions, and the adding instructions for each domain of the domains, wherein the computer-readable medium further stores the repeating instructions.

17. The computer program product of claim 14 wherein the skew-delay-determining instructions comprise:
skew-delay-selecting instructions to select the respective skew delay for each given domain from a clock skew matrix using the selected domain and the given domain; and the computer-readable medium further stores the skew-delay-selecting instructions.

18. The computer program product of claim 14 further comprising:

top-path-determining instructions to determine a plurality of top paths for the selected domain;

calculating instructions to calculate a respective slack value for each path terminating in the selected domain; and violation-selecting instructions to select a plurality of largest timing violations from the respective slack values for each path, wherein each path having one of the plurality of largest timing violations is one of the plurality of top paths; and wherein the computer-readable medium further stores the top-path-determining instructions, the calculating instructions, and the violation-selecting instructions.

19. A computer system for analyzing an integrated circuit design, the computer system comprising:

a processor to execute instructions; and a memory to store the instructions, wherein the instructions comprise:
domain-selecting instructions to select a selected domain from a plurality of domains representing an integrated circuit, wherein
each domain of the domains has a respective clock delay;

skew-delay-determining instructions to determine a respective skew delay relative to the selected domain for each domain;

adding instructions to add the respective skew delay to the respective clock delay to form a respective sum relative to the selected domain for each domain, wherein
the respective sums model clock skew relative to the selected domain.

20. The computer system of claim 19 wherein the instructions further comprise:

violation-determining instructions to determine whether a path originating in an originating domain of the domains and terminating in the selected domain has a timing violation using the respective sum for the originating domain relative to the selected domain.

21. The computer system of claim 19 wherein the instructions further comprise:

repeating instructions to repeat execution of the selecting instructions, the skew-delay determining instructions, and the adding instructions for each domain of the domains.

22. The computer system of claim 19 wherein the determining instructions comprise:

skew-delay-selecting instructions to select the respective skew delay for each given domain from a clock skew matrix using the selected domain and the given domain.

23. The computer system of claim 19 wherein the instructions further comprise:

top-path-determining instructions to determine a plurality of top paths for the selected domain;

calculating instructions to calculate a respective slack value for each path terminating in the selected domain; and violation-selecting instructions to select a plurality of largest timing violations from the respective slack values for each path, wherein each path having one of the plurality of largest timing violations is one of the plurality of top paths.

\* \* \* \* \*